(12) United States Patent
Motohashi

(10) Patent No.: US 8,242,616 B1
(45) Date of Patent: Aug. 14, 2012

(54) METHOD FOR MANUFACTURING SEMICONDUCTOR DEVICE AND MOLDED STRUCTURE

(75) Inventor: Norikazu Motohashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 128 days.

(21) Appl. No.: 12/550,900

(22) Filed: Aug. 31, 2009

Related U.S. Application Data

(60) Provisional application No. 61/092,784, filed on Aug. 29, 2008.

(51) Int. Cl.
*H01L 23/544* (2006.01)
*H01L 21/301* (2006.01)

(52) U.S. Cl. . 257/797; 257/723; 257/787; 257/E23.116; 257/E21.502; 438/113; 438/462

(58) Field of Classification Search .................. 257/787, 257/723, E23.116; 438/113, 462
See application file for complete search history.

(56) References Cited

U.S. PATENT DOCUMENTS

| | | | | | |
|---|---|---|---|---|---|
| 5,989,982 | A | * | 11/1999 | Yoshikazu | 438/462 |
| 6,001,671 | A | * | 12/1999 | Fjelstad | 438/112 |
| 6,077,757 | A | * | 6/2000 | Mizuno et al. | 438/465 |
| 6,173,490 | B1 | * | 1/2001 | Lee et al. | 29/841 |
| 6,462,273 | B1 | * | 10/2002 | Corisis et al. | 174/521 |
| 6,627,987 | B1 | * | 9/2003 | Glenn et al. | 257/704 |
| 7,081,661 | B2 | * | 7/2006 | Takehara et al. | 257/433 |
| 7,470,567 | B2 | * | 12/2008 | Shimanuki | 438/113 |
| 2006/0279003 | A1 | * | 12/2006 | Maruyama et al. | 257/797 |
| 2007/0148918 | A1 | * | 6/2007 | Kinsman et al. | 438/460 |
| 2008/0265445 | A1 | * | 10/2008 | Feger et al. | 257/797 |
| 2009/0102070 | A1 | * | 4/2009 | Feger et al. | 257/797 |

FOREIGN PATENT DOCUMENTS

JP 2005-216989 8/2005

* cited by examiner

*Primary Examiner* — Nitin Parekh
(74) *Attorney, Agent, or Firm* — Young & Thompson

(57) ABSTRACT

There is provided a method for manufacturing a semiconductor device, including: forming an interconnection layer over a support base; mounting a plurality of semiconductor chips over the interconnection layer; molding the plurality of semiconductor chips with resin; forming an alignment mark in the resin; and obtaining a molded structure by removing the interconnection layer, the plurality of semiconductor chips and the resin from the support base after forming the alignment mark.

23 Claims, 12 Drawing Sheets

METHOD FOR MANUFACTURING SEMICONDUCTOR DEVICE AND MOLDED STRUCTURE

This application is based on provisional U.S. application Ser. No. 61/092,784, the content of which is incorporated hereinto by reference.

BACKGROUND

1. Technical Field

The present invention relates to a method for manufacturing a semiconductor device and a molded structure.

2. Related Art

Japanese Laid-open patent publication NO. 2005-216989 discloses a method for manufacturing a multi-chip module, which includes an interconnection layer forming process for forming a module interconnection layer having an insulating layer and an interconnection layer which are laminated and serves as a module interconnection board, on a temporary support board such as a silicon wafer, a molding process for sealing a plurality of semiconductor elements mounted on the module interconnection layer formed in the interconnection layer forming process with a molding resin, and a temporary support board removing process for removing the temporary support board from the body sealed with the molding resin to obtain the multi-chip module. It is described that with this configuration, it is possible to achieve a multi-layered and thin film interconnection layer as a module interconnection board on which semiconductor elements are mounted, at low cost, thereby making it possible to manufacture a thin multi-chip module.

A semiconductor wafer such as a silicon wafer is typically provided with an alignment mark such as a notch (V-shaped notch), an orientation flat and so on. Such an alignment mark allows adjustment of misalignment in a θ direction (rotational direction of a substrate) of the semiconductor wafer.

SUMMARY OF THE INVENTION

In the related art, however, when the temporary support board such as the silicon wafer is removed from the body sealed with the molding resin, there is no alignment mark on the molding resin-sealed body and the alignment of the molding resin-sealed body after the removal of the temporary support board could not be simply and conveniently carried out.

In one embodiment, there is provided a method for manufacturing a semiconductor device, including:

forming an interconnection layer over a support base;

mounting a plurality of semiconductor chips over the interconnection layer;

molding the plurality of semiconductor chips with resin;

forming an alignment mark in the resin; and obtaining a molded structure by removing the interconnection layer, the plurality of semiconductor chips and the resin from the support base after forming the alignment mark.

In another embodiment, there is provided a molded structure including:

an interconnection layer;

a plurality of semiconductor chips mounted over the interconnection layer; and resin formed to mold the plurality of semiconductor chips, wherein an alignment mark is formed in the resin.

With the above configuration, since the alignment mark is formed in the resin after the support base is removed from the interconnection layer, it is possible to easily carry out the alignment of the molded structure.

BRIEF DESCRIPTION OF THE DRAWINGS

The above and other objects, advantages and features of the present invention will be more apparent from the following description taken in conjunction with the accompanying drawings, in which.

DETAILED DESCRIPTION

Figure 1A:
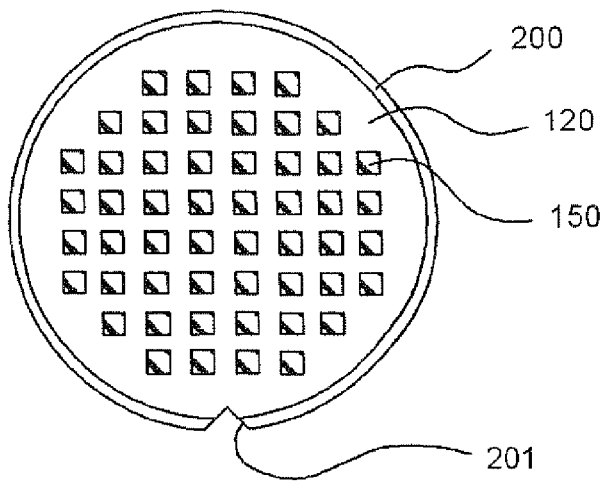
FIGS. 1A to 1C are top views showing interim steps of a sequence of manufacturing a semiconductor device according to an embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereinafter, exemplary embodiments of the present invention will be described with reference to the accompanying drawings. Throughout the drawings, like elements are denoted by like reference numerals and explanation of which will not be repeated.

First Embodiment

This embodiment includes a process of mounting a plurality of semiconductor elements (semiconductor chips) on a wafer-shaped support base while forming circuits thereon, molding the circuits and the semiconductor elements with a molding resin (resin), and removing a body molded with the molding resin from the support base to obtain a molded structure such as a wafer-shaped multi-chip module or the like, and a process of forming an alignment mark on the molding resin.

Figure 1B:
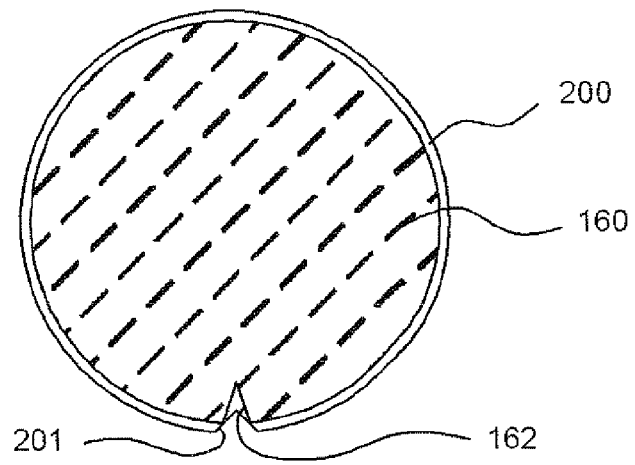
Figure 1C:
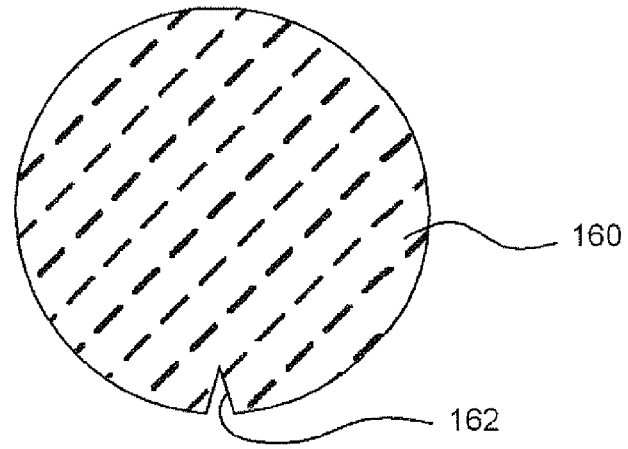

FIGS. 1A to 1C are top views showing interim steps of a sequence of manufacturing a semiconductor device 102 according to this embodiment.

FIG. 1A shows a state where an interconnection layer 120 is disposed on a support base 200 and a plurality of semiconductor chips 150 is additionally disposed in a flat state on the interconnection layer 120. Here, the support base 200 has a circular shape. The support base 200 is provided with an alignment mark 201. The alignment mark 201 may be configured as, for example, a cut portion. The support base 200 may be made of, for example, glass, quartz glass, sapphire, aluminum nitride, silicon or the like. In this embodiment, the support base 200 may be provided as a semiconductor wafer. In this case, the alignment mark 201 may be typically configured as a notch (V-shape notch), an orientation flat or the like, provided in the semiconductor wafer. Since the interconnection layer 120 is disposed on the support base 200, a shape of the alignment mark 201 on the support base 200 is also reflected in the interconnection layer 120.

FIG. 1B shows a state where a molding resin 160 is formed on the interconnection layer 120 and the plurality of semiconductor chips 150 and the interconnection layer 120 are sealed by the molding resin 160. Here, the molding resin 160 may be formed to have substantially the same shape as the support base 200 when seen in a plan view from above. That is, in this embodiment, the molding resin 160 may be formed to have the same circular shape as the semiconductor wafer.

In addition, an alignment mark 162 is provided in the molding resin 160 at a position at which the alignment mark 162 overlaps with an alignment mark 201 on the support base 200 when seen in a plan view. The alignment mark 162 may have the same shape as the alignment mark 201 on the support base 200. That is, the alignment mark 162 may have the same shape as, for example, a cut portion, a notch or an orientation flat which is typically provided in the semiconductor wafer, or the like. The same shape used herein includes substantially the same shape as the alignment mark 201. The substantial same shape used herein may refer to the sameness so much to carry out an alignment based on the alignment mark 162 with an existing apparatus having an alignment mechanism to align a semiconductor wafer using, for example, a notch or an orientation flat provided in a conventional semiconductor wafer.

FIG. 1C shows a state where the support base 200 is removed from the interconnection layer 120, the plurality of semiconductor chips 150 and the molding resin 160. In this embodiment, the alignment mark 162 is formed in the molding resin 160 at a position corresponding to the alignment mark 201 on the support base 200. Accordingly, an alignment of the semiconductor chips 150, the molded structure 100 and the interconnection layer 120 can be achieved even when the support base 200 is removed after the semiconductor chips 150 are sealed with the molding resin 160.

In this embodiment, the alignment mark 162 may be configured to allow for the use of various existing alignment mechanisms for detecting misalignment in a θ direction of the semiconductor wafer. With this configuration, even after the support base 200 is removed, the alignment mark 162 may be used to detect misalignment in the θ direction of the molded structure 100 with various existing alignment mechanisms for alignment of the molded structure 100. Accordingly, for example, the alignment can be easily carried out when the molding resin 160 is cut to sectionalize the semiconductor chips 150.

In addition, when the semiconductor chips 150 are arranged on the support base 200, the arrangement of the semiconductor chips 150 in the θ direction depends on the position of the alignment mark 201 on the support base 200. In this embodiment, by providing the alignment mark 162 on the molding resin 160 at the position corresponding to the alignment mark 201 on the support base 200, since the alignment mark 162 maintains the position relationship in θ direction between the alignment mark 201 and the semiconductor chips 150, the position of the semiconductor chips 150 in the θ direction can be detected based on the alignment mark 162.

Next, a sequence of manufacturing the semiconductor device 102 will be described with reference to a process sectional view.

FIGS. 2A to 2D are process sectional views showing one example of a sequence of manufacturing the semiconductor device 102 according to this embodiment.

Figure 2A:
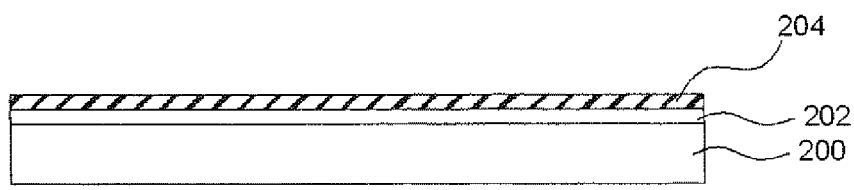
FIGS. 2A to 2D are process sectional views showing one example of a sequence of manufacturing a semiconductor device according to an embodiment of the present invention.

First, a removal layer 202 is formed on the support base 200 using, for example, a sputtering method, and is then subjected to heat treatment. The removal layer 202 may be made of a material capable of being dissolved or from which gas is produced due to a chemical reaction caused when the material is irradiated with a laser. Specifically, the removal layer 202 may be made of, for example, metal oxide, metal nitride, metal oxynitride or the like. Next, a seed layer 204 is formed on the removal layer 202 (FIG. 2A). The seed layer 204 may be made of, for example, CU/Ti or the like and may be formed using a sputtering method. Although not shown, a resist film having a predetermined pattern may be formed on the seed layer 204 and a circuit pattern may be formed by patterning the seed layer 204 using the resist film as a mask. After forming the circuit pattern, the resist film may be removed using an organic solvent.

Figure 2B:
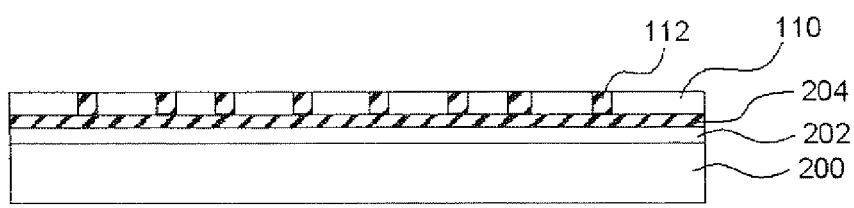

Thereafter, an insulating resin film 110 is formed on the seed layer 204. The insulating resin film 110 may be, for example, a polyimide layer. The insulating resin film 110 may be formed by applying and sintering an insulating material. Subsequently, via holes leading to the seed layer 204 are formed in the insulating resin film 110 and vias 112 are formed by filling the via holes with a conductive material using an electroplating method (FIG. 2B). The vias 112 may be made of, for example, Cu/Ni. In addition, a seed film made of Cu/Ti or the like may be formed on the insulating resin film 110 using, for example, a sputtering method, and a resist film having a predetermined pattern may be formed thereon. Subsequently, an interconnection 114 may be formed on the seed film exposed through openings in the resist film using an electroplating method.

Figure 2C:
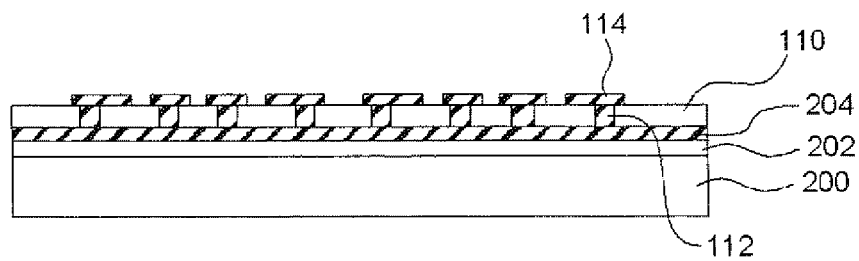

Subsequently, the resist film may be removed using an organic solvent. Thereafter, a circuit pattern constituted by the seed film and the interconnection 114 is formed by patterning the seed film using the interconnection 114 as a mask (FIG. 2C).

Figure 2D:
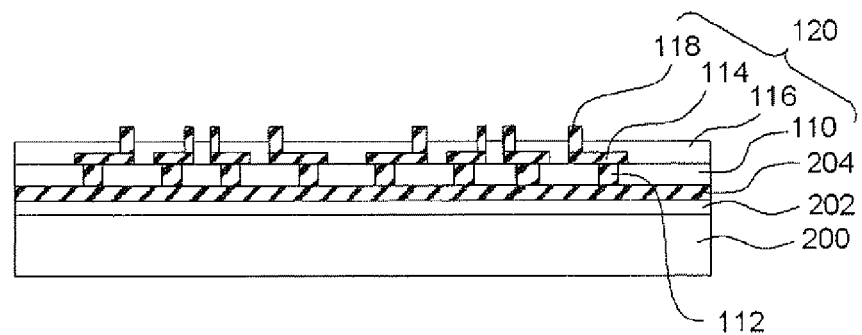

In addition, a solder resist layer 116 is formed on the interconnection 114, via holes leading to the interconnection 114 are formed in the solder resist layer 116, and connection terminals 118 are formed by filling the via holes with a conductive material. Accordingly, an interconnection layer 120 is formed, which is constituted by the insulating resin film 110, the vias 112, the interconnection layer 114, the solder resist layer 116, the connection terminals 118 and so on (FIG. 2D).

Figure 3A:
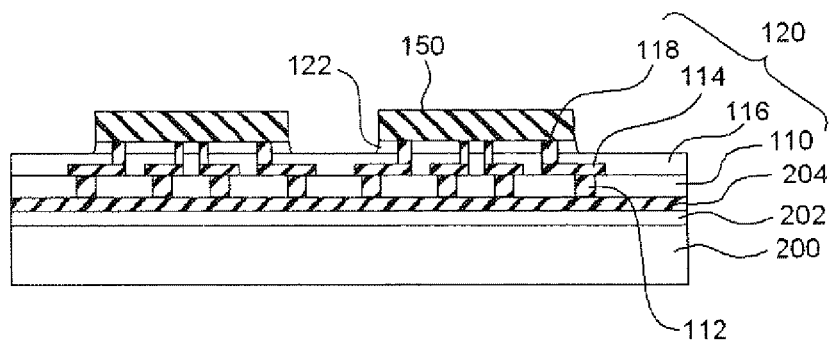
FIGS. 3A to 3C are process sectional views showing one example of a sequence of manufacturing a semiconductor device according to an embodiment of the present invention.

Thereafter, the plurality of semiconductor chips 150 is juxtaposed on the interconnection layer 120 through an underfill 122 (FIG. 3A).

Thereafter, while the semiconductor chips 150 are sealed with the molding resin 160, in this embodiment, the alignment mark 162 (see FIGS. 1B and 1C) is formed on the molding resin 160 at the same time as when the molding resin 160 is formed. The molding resin 160 may be made of, for example, epoxy resin. In this embodiment, a mold used to mold the semiconductor chips 150 with the molding resin 160 has a dedicated shape such that the alignment mark 162 is formed on the molding resin 160. Accordingly, the alignment mark 162 can be automatically formed on the molding resin 160 when the mold is released.

Hereinafter, the above-described sequence will be described with reference to FIGS. 5A to 5D.

Figure 5A:
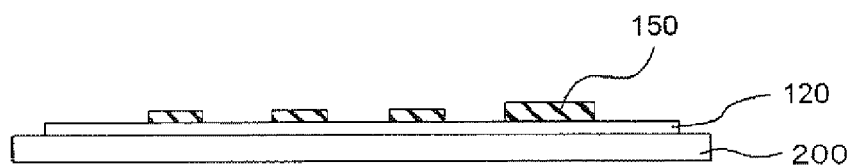
FIGS. 5A to 5D are process sectional views showing one example of a sequence of manufacturing a semiconductor device according to an embodiment of the present invention.
Figure 5B:
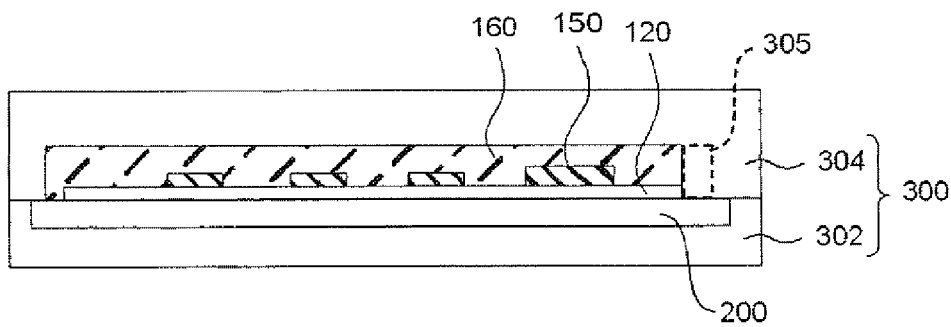

FIG. 5A is a schematic sectional view showing a state where the interconnection layer 120 is disposed on the support base 200 and the plurality of semiconductor chips 150 is disposed thereon. The removal layer 202 and so on are not shown in this figure although they are included in the structure. In addition, although this figure shows the semiconductor chips 150 having different sizes, the plurality of semiconductor chips 150 may have either the same size or different sizes. FIG. 5A corresponds to the state shown in FIG. 1A. Subsequently, a mold 300 is used to form the molding resin 160 (FIG. 5B). The mold 300 includes a lower mold 302 and an upper mold 304. The lower mold 302 of the mold 300 has a circular concave portion for receiving the circular support base 200. The upper mold 304 of the mold 300 also has a circular concave portion for forming the molding resin 160 in a circular shape. Here, as described with reference to FIG. 1B, the upper mold 304 has a structure in which a convex portion 305 corresponding to the alignment mark 162 is formed in the circular concave portion in order to form the alignment mark 162 in the molding resin 160.

Figure 5C:
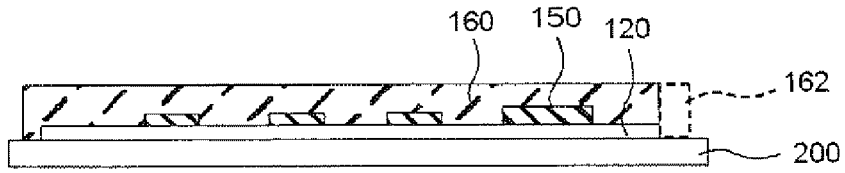
Figure 5D:
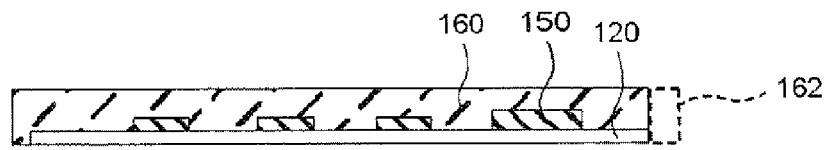

Thereafter, when the mold 300 is detached, a structure where the alignment mark 162 is formed in the molding resin 160 may be obtained (FIG. 5C). FIG. 5C corresponds to the state of FIG. 1B. Thereafter, the support base 200 is removed from the interconnection layer 120 to obtain the molded structure 100 (FIG. 5D). This sequence will described with reference to FIG. 3B again.

Figure 3B:
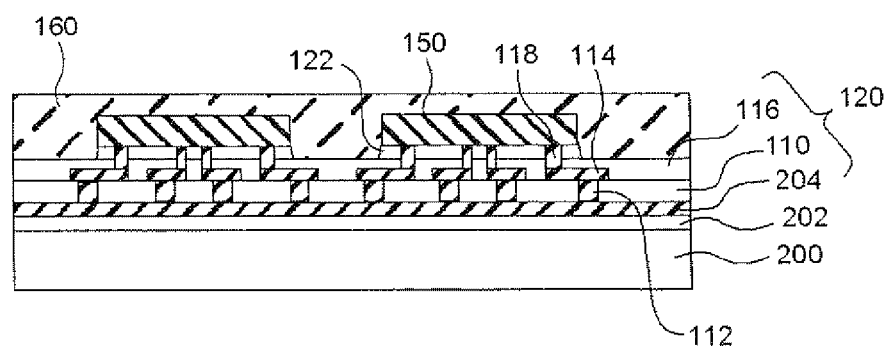

FIG. 3B shows a state where the semiconductor chips 150 are sealed with the molding resin 160, like FIG. 5C. Although the alignment mark 162 is not shown in FIG. 3B, the alignment mark 162 is formed in the molding resin 160 in this step.

Figure 3C:
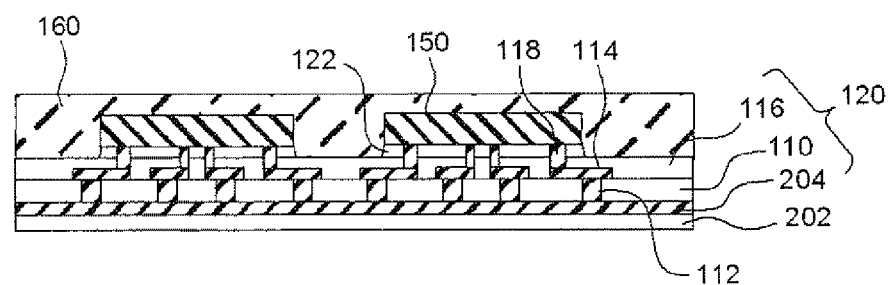

Subsequently, the support base 200 is removed from the interconnection layer 120 (FIG. 3C). At this time, removal occurs at the interface between the removal layer 202 and the support base 200 or within the removal layer 202 due to shrinkage stress of the molding resin 160. If a material which is dissolved when irradiated with a laser is used as the removal layer 202, the support base 200 can be removed from the interconnection layer 120 by irradiating the removal layer 202 with a laser from the rear side of the support base 200. In this case, the support base 200 may be made of a material through which the laser can penetrate, such as glass or a semiconductor wafer. In this case, gas is generated from the chemical change in the material of the removal layer 202 due to the irradiation of laser, thereby lowering adhesion and hence producing removal along with the effect of shrinkage stress of the molding resin 160. Alternatively, the material of the removal layer 202 is dissolved (ablated) to produce removal.

Figure 4A:
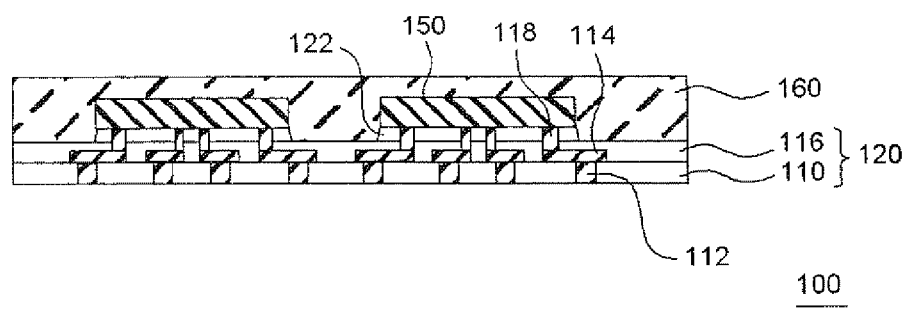
FIGS. 4A to 4C are process sectional views showing one example of a sequence of manufacturing a semiconductor device according to an embodiment of the present invention.

Subsequently, the removal layer 202 and the seed layer 204 are removed by wet etching or the like using a medicinal fluid (FIG. 4A). This state corresponds to the states of FIGS. 1C and 5D. Accordingly, the molded structure 100 can be obtained where the plurality of semiconductor chips 150 is sealed with the molding resin 160. Here, as shown in FIG. 5D, since an alignment mark such as the alignment mark 162 is formed in the molding resin 160, alignment can be easily carried out in later processes.

Thereafter, a solder resist layer 170 or the like is formed below the interconnection layer 120.

Figure 4B:
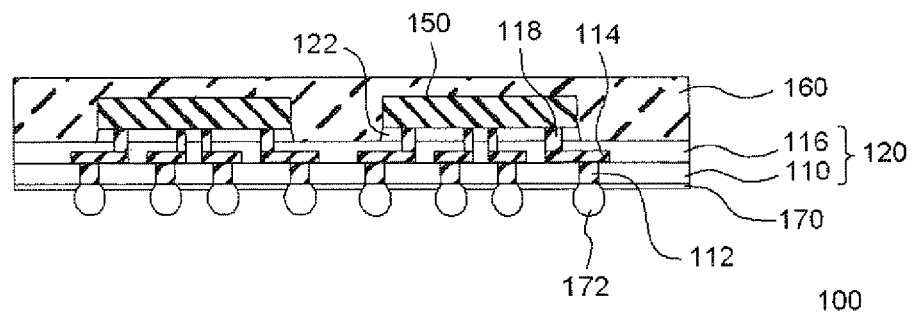
Figure 4C:
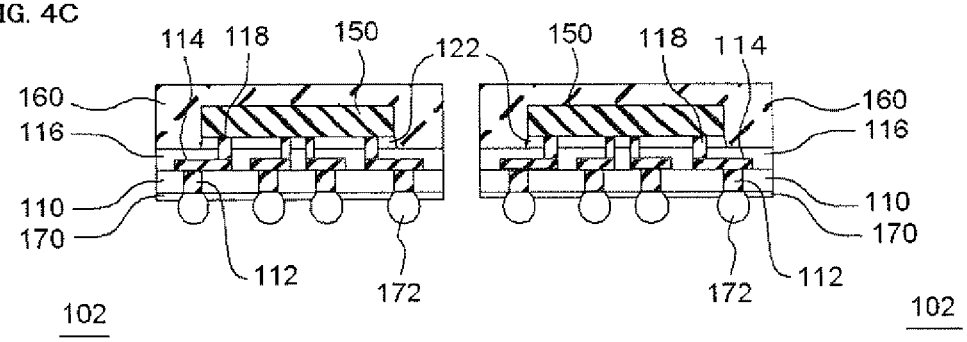

Subsequently, solder balls 172 contacting the vias 112 are formed (FIG. 4B). Subsequently, the molding resin 160 is sectionalized for each semiconductor chip 150 so as to obtain a plurality of semiconductor devices 102 (FIG. 4C). In this embodiment, since the alignment mark 162 is formed in the molding resin 160, the alignment can be carried out using the alignment mark 162 when the molded structure 100 is cut and sectionalized as the plurality of semiconductor devices 102.

Figure 6A:
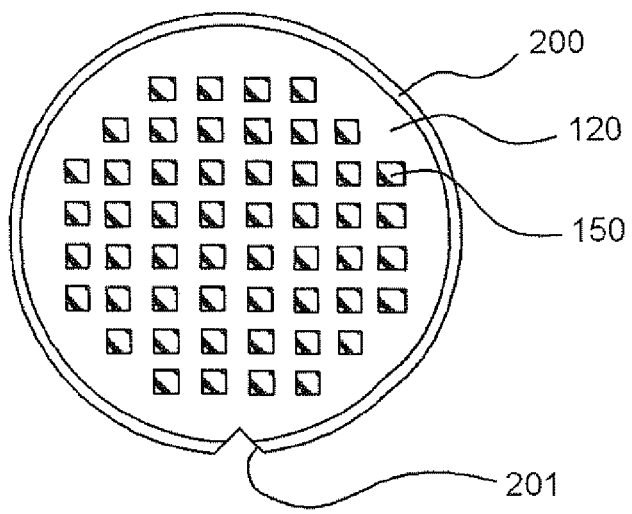
FIGS. 6A to 6C are views showing another example of an alignment mark formed on a molding resin.
Figure 6B:
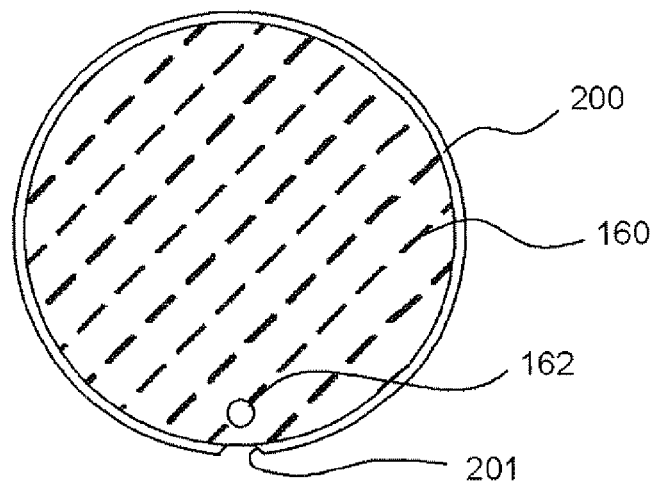
Figure 6C:
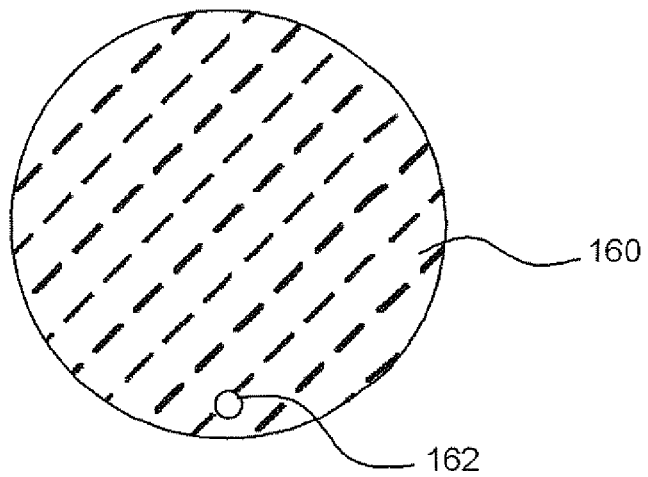

FIGS. 6A to 6C are views showing another example of the alignment mark 162 formed on the molding resin 160. The alignment mark 162 may be provided as a through hole as shown in FIGS. 6B and 6C. When such an alignment mark 162 is used, alignment can be carried out using an optical device. Although a circular through hole (pin hole) is shown here, for example, a rectangular through hole or a linear slit may be likewise employed as long as it can be used for optical alignment.

Next, a particular example of the semiconductor device 102 to which the alignment mark 162 is applied will be described in this embodiment.

Figure 7A:
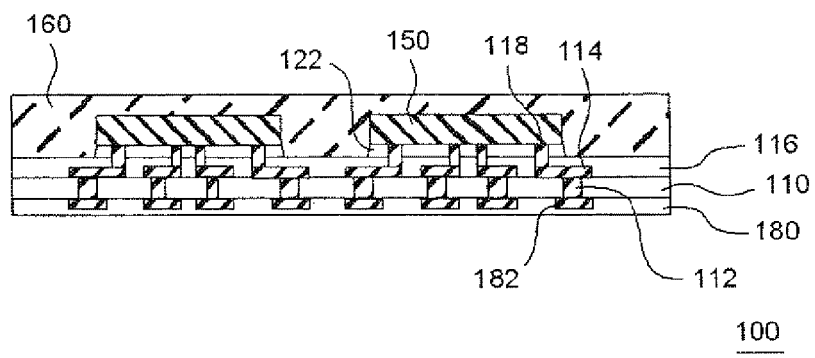
FIGS. 7A to 7C are process sectional views showing another example of a sequence of manufacturing a semiconductor device after forming the configuration shown in FIG. 4A.
Figure 7B:
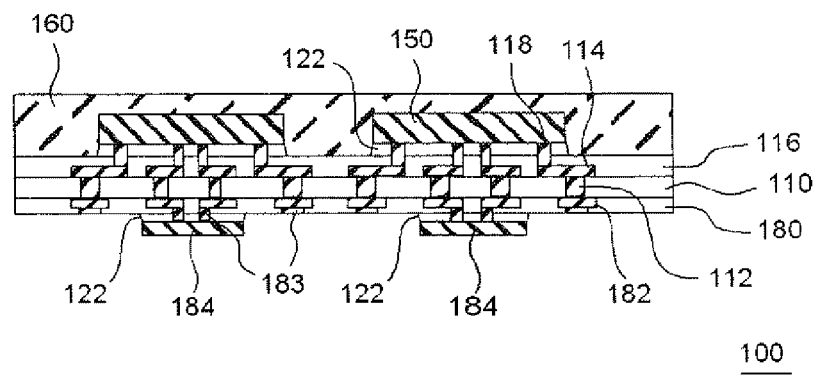
Figure 7C:
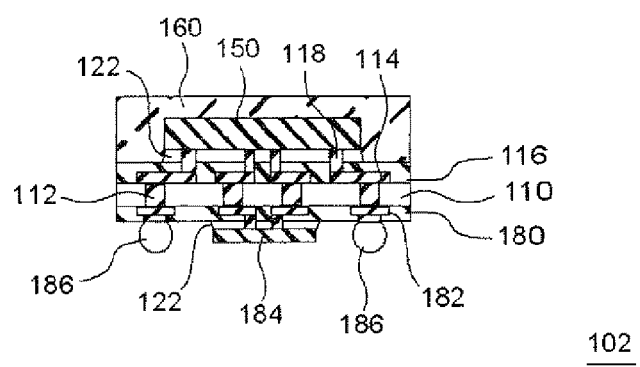

FIGS. 7A to 7C are process sectional views showing another example of a sequence of manufacturing the semiconductor device 102 after forming the configuration shown in FIG. 4A.

Here, after forming the configuration shown in FIG. 4A, a seed film made of Cu/Ti or the like is formed on the side opposing the side on which the solder resist layer 116 of the insulating resin film 110 is formed, using, for example, a sputtering method, and then is patterned using a resist film to form a circuit and an interconnection 182. After forming the circuit, the resist film may be removed using an organic solvent.

In addition, a solder resist layer 180 is formed on the interconnection 182, via holes leading to the interconnection 182 are formed in the solder resist layer 180, and connection terminals 183 are formed by filling the via holes with a conductive material. Thereafter, semiconductor chips 184 are mounted below the solder resist layer 180 through an underfill 122 (FIG. 7B). Here, although not particularly limited, the semiconductor chips 184 may be provided corresponding to the semiconductor chips 150.

Thereafter, solder balls 186 contacting the connection terminals 183 are formed. Subsequently, the molding resin 160 is sectionalized for each semiconductor chip 150 and each semiconductor chip 184 so as to obtain a plurality of semiconductor devices 102 (FIG. 7C). At this time, since the alignment mark 162 is formed in the molding resin 160, the alignment can be carried out using the alignment mark 162 when the molded structure 100 is cut and sectionalized as the plurality of semiconductor devices 102.

FIGS. 8A to 8D are process sectional views showing another example of the configuration described with reference to FIGS. 7A to 7C.

Figure 8A:
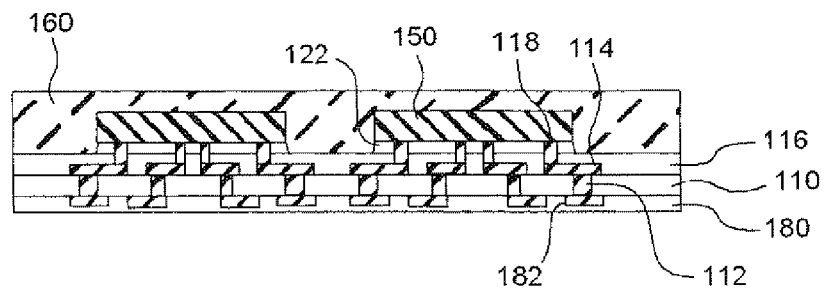
FIGS. 8A to 8D are process sectional views showing still another example of a sequence of manufacturing a semiconductor device after forming the configuration shown in FIG. 4A.
Figure 8B:
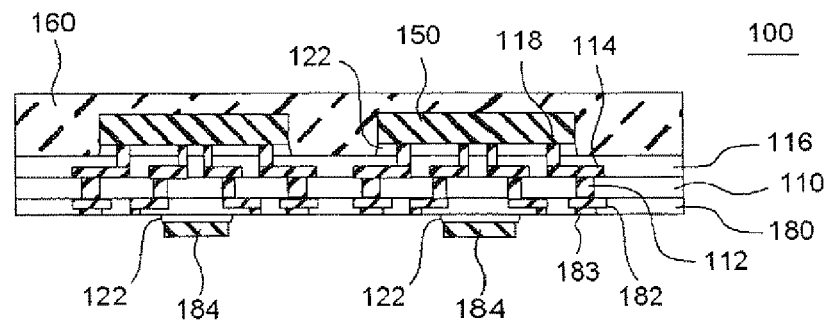

Like the description of FIGS. 7A and 7B, the solder resist layer 180, the interconnection 182, the connection terminals 183, the underfill 122 and the semiconductor chips 184 are formed on the side opposing the side on which the solder resist layer 116 of the insulating resin film 110 is formed (FIGS. 8A and 8B). Here, a pattern of the interconnection 182 and the connection terminals 183 is appropriately designed so as to correspond to the individual semiconductor devices 102.

Figure 8C:
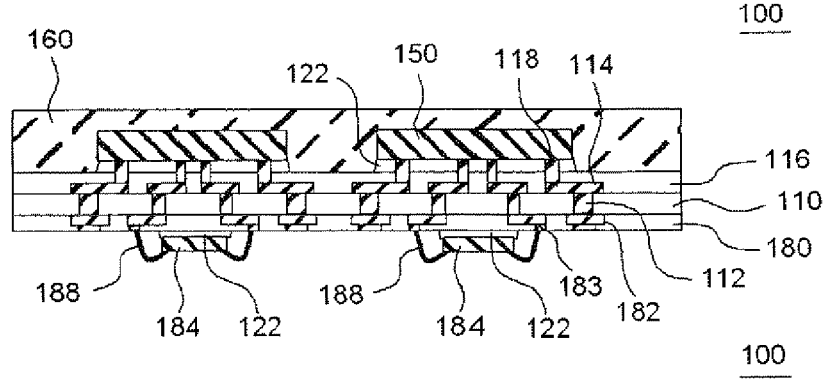

This example is different from the example shown in FIG. 7B in that the semiconductor chips 184 are connected to the connection terminals 183 in the solder resist layer 180 through a boding wire 188 (FIG. 8C).

Figure 8D:
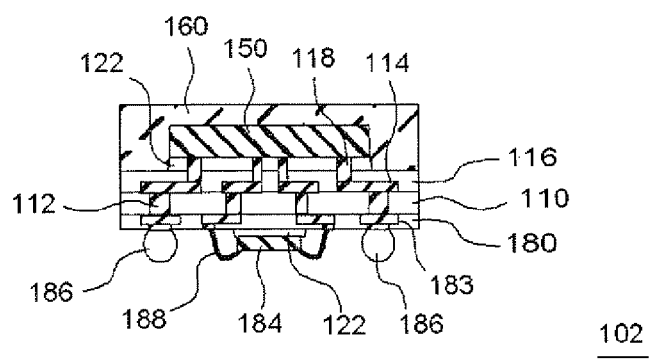

Thereafter, the solder balls 186 contacting the connection terminals 183 are formed. Subsequently, the molding resin 160 is sectionalized for each semiconductor chip 150 and each semiconductor chip 184 so as to obtain a plurality of semiconductor devices 102 (FIG. 8D). At this time, since the alignment mark 162 is formed in the molding resin 160, the alignment can be carried out using the alignment mark 162 when the molded structure 100 is cut and sectionalized as the plurality of semiconductor devices 102.

According to this embodiment, since the alignment mark 162 is provided in the molding resin 160 of the molded structure 100, the alignment of the molded structure 100 can be carried out even after the support base 200 is removed. Accordingly, misalignment in a θ direction of the molded structure 100 can be detected without using a fine alignment pattern or the like formed on the interconnection layer 120. Accordingly, misalignment in a θ direction of the semiconductor chips 150 mounted on the interconnection layer 120 can be adjusted. This allows for a reduction in the time taken to manufacture semiconductor devices, and hence reduction of Turn Around Time (TAT).

In addition, since the alignment mark 162 provided in the molding resin 160 have the same shape as a notch, an orientation flat or the like provided in a conventional semiconductor wafer, an existing apparatus having an alignment mechanism for semiconductor wafers can be used without making a special alteration to the apparatus. Accordingly, an alignment can be easily carried out when processes such as, for example, surface treatment of the molding resin, rewiring, chip mounting, BGA mounting, dicing, or the like are performed on the molded structure 100 after the molded structure 100 is removed from the support base 200.

Second Embodiment

FIGS. 9A to 10D are views showing a sequence of manufacturing a semiconductor device according to this embodiment.

This embodiment is different from the first embodiment in a method for forming the alignment mark 162 in the molding resin 160. More specifically, this embodiment is different from the first embodiment in that, instead of forming the alignment mark 162 using a mold, the alignment mark 162 is formed using a laser or a machining process after the forming of the molding resin 160 in a mold having no alignment mark 162. In this embodiment, after forming the molding resin 160 using a typical mold, the alignment mark 162 can be formed using the laser or machining process after the release of the mold or before the removal of the support base 200.

Figure 9A:
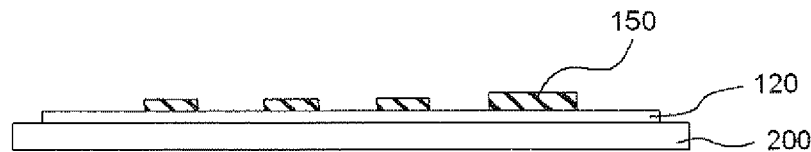
FIGS. 9A to 9E are process sectional views showing one example of a sequence of manufacturing a semiconductor device according to an embodiment of the present invention.
Figure 9B:
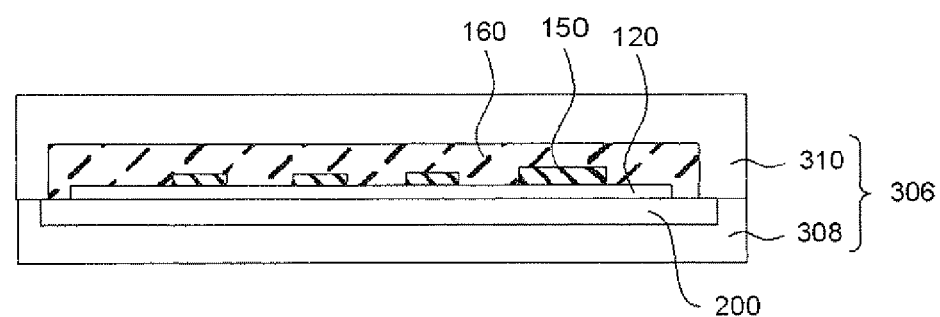
Figure 9C:
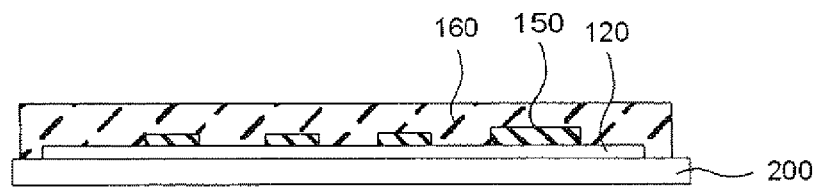
Figure 10A:
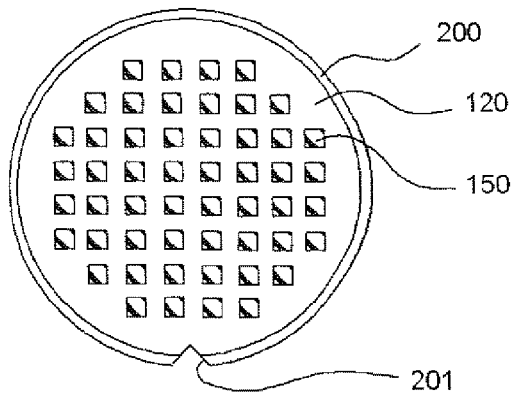
FIGS. 10A to 10D are top views showing interim steps of a sequence of manufacturing a semiconductor device according to an embodiment of the present invention.
Figure 10B:
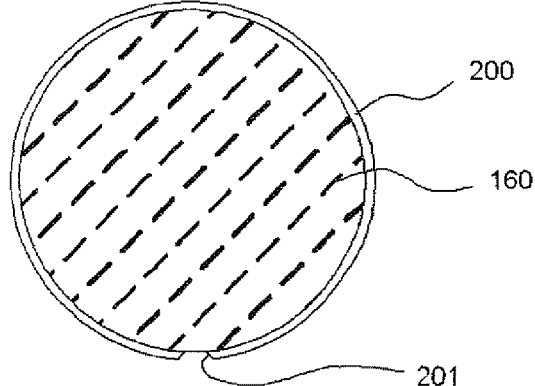
Figure 10C:
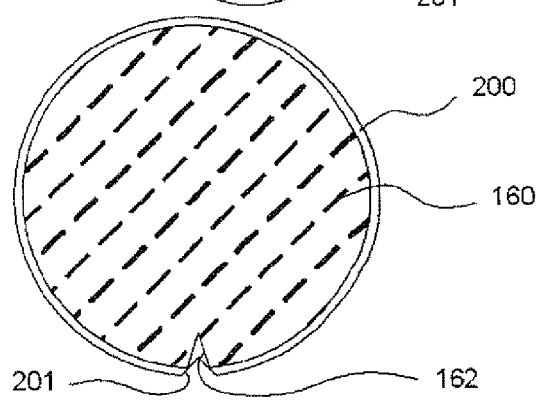
Figure 10D:
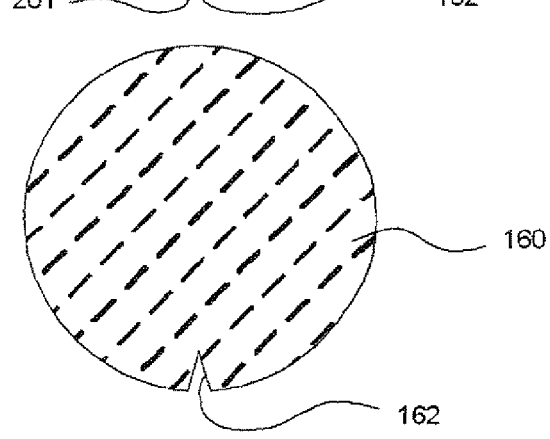

FIG. 10A is a view showing a state where the interconnection layer 120 is disposed on the support base 200 and the plurality of semiconductor chips 150 is additionally disposed on the interconnection layer 120. This embodiment has the same configuration as that shown in FIG. 1A in the first embodiment. A sectional view at this time corresponds to FIG. 9A. Thereafter, in this embodiment, a mold 306 is used to form the molding resin 160 on the interconnection layer 120 and the plurality of semiconductor chips 150 is sealed with the molding resin 160 (FIG. 9B). In this embodiment, the mold 306 includes a lower mold 308 and an upper mold 310. The lower mold 308 of the mold 306 has a circular concave portion for receiving the circular support base 200. The upper mold 310 of the mold 306 also has a circular concave portion for forming the molding resin 160 in a circular shape. Here, the upper mold 310 is different from the upper mold 304 (see FIG. 5B) in the first embodiment in that the former does not have the convex portion 305 for forming the alignment mark 162 in the molding resin 160. Thereafter, a molded structure is detached from the mold 306 (FIG. 9C). A top view at this time corresponds to FIG. 10B. At this time, the alignment mark 162 is not formed in the molding resin 160.

Figure 9D:
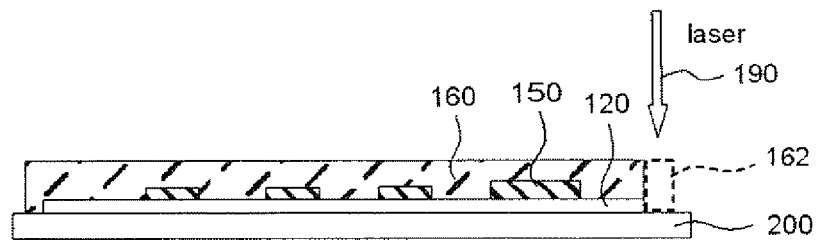

Subsequently, as shown in FIG. 9D, the molding resin 160 is irradiated with a laser 190 to form the alignment mark 162 in the molding resin 160. A top view at this time corresponds to FIG. 10C. In this embodiment, the alignment mark 162 may be, for example, provided as a cut portion such as a notch or an orientation flat, or a through hole such as a pin hole. Here, a portion corresponding to the alignment mark 162 of the interconnection layer 120 is removed by the laser 190.

Figure 9E:
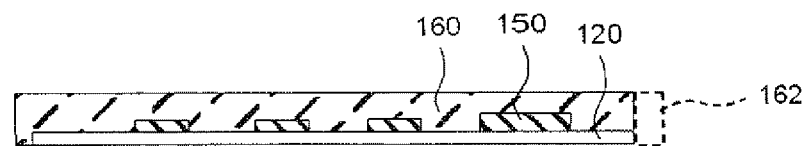

Subsequently, the support base 200 is removed from the interconnection layer 120. Accordingly, the molded structure 100 having the alignment mark 162 is obtained (FIG. 9E). A top view at this time corresponds to FIG. 10D.

In this embodiment, a removal layer (not here shown) provided between the support base 200 and the interconnection layer 120 may be made of a material which is dissolved by the laser 190. The support base 200 can be removed from the molding resin 160 by irradiation of the laser. When the alignment mark 162 is formed using the laser 190, the support base 201 can be subsequently removed in the same apparatus.

In this manner, when the alignment mark 162 is formed using the laser 190, a laser wavelength and energy are selected by which the resin of the molding resin 160 is ablated. At this time, if the support base 200 is made of a material transparent to the laser wavelength, the support base 200 may be reused after detaching the support base 200 from the interconnection layer 120. Here, the forming of the alignment mark 162 and the dissolving of the removal layer are different from each other in terms of the irradiation conditions of the laser 190. The dissolving the removal layer requires less power from the laser 190.

Figure 11A:
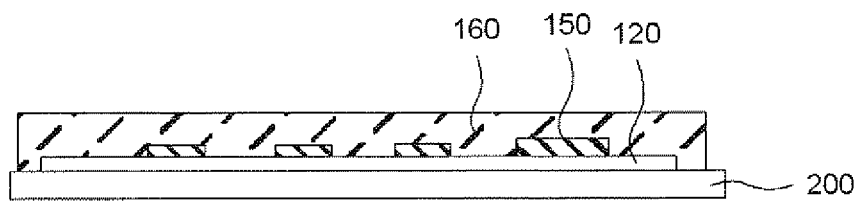
FIGS. 11A to 11C are process sectional views showing one example of a sequence of manufacturing a semiconductor device according to an embodiment of the present invention.
Figure 11B:
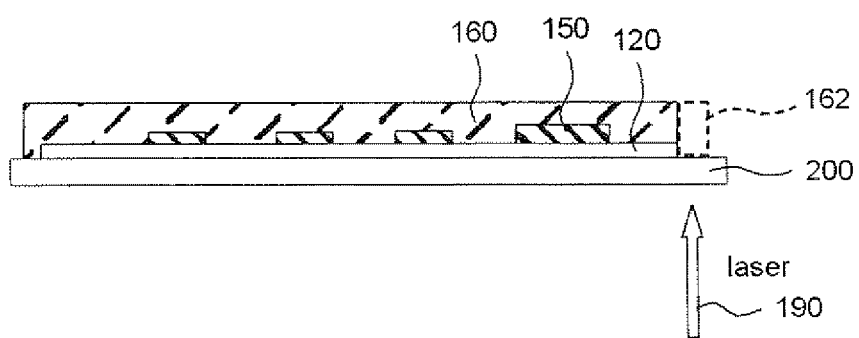
Figure 11C:
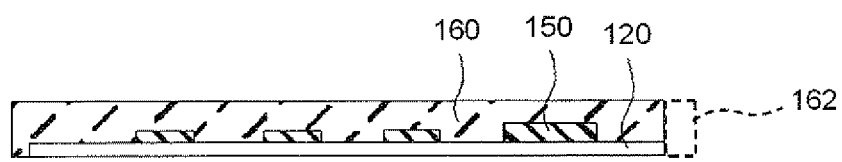

FIGS. 11A to 11C are sectional views showing another example of the sequence shown in FIGS. 9A to 9E.

Although FIGS. 9A to 9E show an example of irradiating the molding resin 160 with the laser 190, if the support base 200 is made of a material transparent to the laser wavelength of the laser 190, as shown in FIG. 11B, the alignment mark 162 may be formed in the molding resin 160 by irradiating a rear side of the support base 200 (the side opposing the side on which the molding resin 160 is formed) with the laser 190. In this case, the support base 200 may be also reused after detaching the support base 200 from the interconnection layer 120.

In addition, in this example, by forming the alignment mark 162 and then irradiating the entire surface of the support base 200 with the laser 190 from the rear side of the support base 200, the process of removing the support base 200 from the interconnection layer 120 may be simultaneously performed.

Figure 12A:
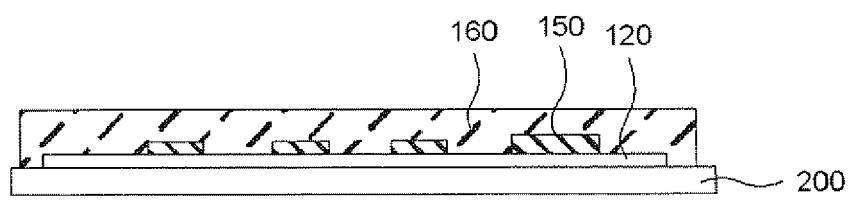
FIGS. 12A to 12C are process sectional views showing one example of a sequence of manufacturing a semiconductor device according to an embodiment of the present invention.
Figure 12B:
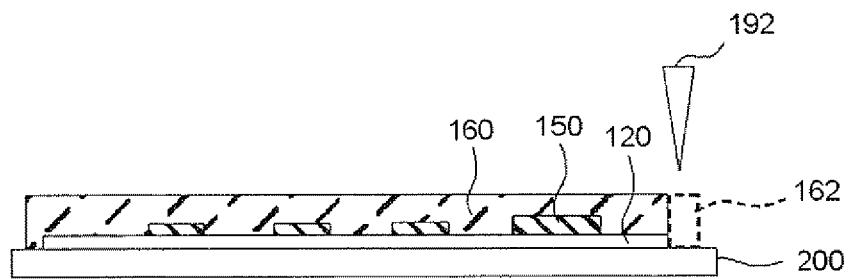
Figure 12C:
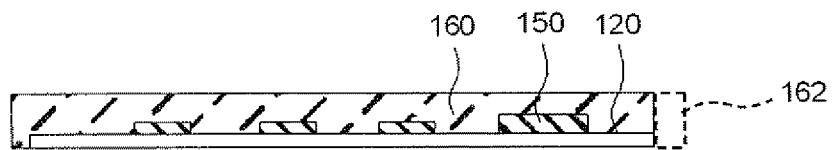

FIGS. 12A to 12C are sectional views showing still another example of the sequence shown in FIGS. 9A to 9E.

Here, as shown in FIG. 12B, the alignment mark 162 can be formed in the molding resin 160 using a machining process 192. Examples of the machining process 192 may include a punching process using a drill, or a cutting process using a cutting tool such as a cutter.

While the embodiments of the present invention have been described with reference to the drawings, these embodiments are only by way of example of the present invention, but the present invention may employ other different configurations.

For example, the alignment mark 162 described in the above embodiments may be formed at any positions on the outer circumference of the molding resin 160 as long as the alignment mark 162 is provided at a position corresponding to the alignment mark 201 on the support base 200 to allow the molded structure 100 to maintain the information on the alignment mark 201.

In addition, the process of removing the support base 200 from the interconnection layer 120 may be performed by immersing the support base 200, on which the interconnection layer 120, the semiconductor chips 150 and the molding resin 160 are formed, in a removal solution. This allows introduction of the removal solution into an interface with the removal layer 202 for dissolution of the removal layer 202.

It is apparent that the present invention is not limited to the above embodiments, and may be modified and changed without departing from the scope and spirit of the invention.

What is claimed is:

1. A method for manufacturing a semiconductor device, comprising:
   forming an interconnection layer over a support base;
   mounting a plurality of semiconductor chips on said interconnection layer;
   molding said plurality of semiconductor chips with a resin layer, the resin being in contact with the plurality of semiconductor chips, to form a molded structure;
   forming an alignment mark in said resin layer, wherein the alignment mark is formed exclusively in a peripheral portion of said resin layer, as seen in plan view; and
   removing said support base from the molded structure, after forming said alignment mark.

2. The method as set forth in claim 1, wherein said alignment mark is arranged in the resin layer to detect misalignment in a rotational (θ) direction of said molded structure.

3. The method as set forth in claim 1, wherein said step of molding the plurality of semiconductor chips with resin and said step of forming the alignment mark are simultaneously performed using a mold configured to shape said resin and form said alignment mark in said resin.

4. The method as set forth in claim 1, wherein said step of forming the alignment mark is performed by irradiating said resin with a laser after said step of molding the plurality of semiconductor chips with resin.

5. The method as set forth in claim 4, wherein said step of molding the plurality of semiconductor chips with resin is performed using a mold configured to shape said resin.

6. The method as set forth in claim 1, wherein said step of forming the alignment mark is performed by subjecting said resin to a machining process after said step of molding the plurality of semiconductor chips with resin.

7. The method as set forth in claim 6, wherein said step of molding the plurality of semiconductor chips with resin is performed using a mold configured to shape said resin.

8. The method as set forth in claim 1, wherein said support base has a circular shape when seen in a plan view, and wherein said resin is formed in the same shape as said support base when seen in a plan view in said step of molding the plurality of semiconductor chips with resin.

9. The method as set forth in claim 1, wherein said support base is a semiconductor wafer in which an alignment mark is formed, and wherein said alignment mark formed in said resin is provided at a position corresponding to said alignment mark of said support base.

10. The method as set forth in claim 9, wherein said alignment mark of said support base is a notch or an orientation flat.

11. The method as set forth in claim 9, wherein said alignment mark of said resin has the same shape as said alignment mark of said support base.

12. The method as set forth in claim 10, wherein said alignment mark of said resin has the same shape as said alignment mark of said support base.

13. The method as set forth in claim 1, wherein said alignment mark of said resin has the same shape as a notch or an orientation flat which is formed in a semiconductor wafer.

14. The method as set forth in claim 1, wherein said alignment mark of said resin is a through hole.

15. The method as set forth in claim 1, further comprising:
   forming a removal layer between said support base and said interconnection layer, and said interconnection layer is formed over said support base through said removal layer in said step of forming the interconnection layer over the support base, and
   dissolving said removal layer and removing the molded structure.

16. The method as set forth in claim 15, wherein said removal layer is dissolved by irradiating said support base from a rear side of said support base with a laser of a wavelength transparent to said support base.

17. A molded structure, comprising:
   an interconnection layer;
   a plurality of semiconductor chips mounted on said interconnection layer;
   a resin layer formed in contact with the plurality of semiconductor chips to mold said plurality of semiconductor chips, and
   an alignment mark formed in the resin layer, wherein the alignment mark is formed exclusively in a peripheral portion of said resin layer, as seen in plan view.

18. The molded structure as set forth in claim 17, wherein said alignment mark is arranged in the resin layer to provide alignment of the structure in a rotational (θ) direction.

19. The molded structure as set forth in claim 17, wherein said alignment mark has a shape of a notch or an orientation flat which is a same shape as a notch or orientation flat formed in a conventional semiconductor wafer.

20. The molded structure as set forth in claim 17, wherein said alignment mark is a through hole that extends through an entire thickness of the resin layer.

21. The molded structure as set forth in claim 17, wherein the structure has a circular shape.

22. The molded structure as set forth in claim 21, wherein the resin layer includes only a single alignment mark.

23. The molded structure as set forth in claim 17, wherein the resin layer is formed on an entirety of a surface of the interconnection layer.

* * * * *